United States Patent [19]

Nozaki et al.

[11] Patent Number: 4,764,327

[45] Date of Patent: Aug. 16, 1988

[54] PROCESS OF PRODUCING PLASTIC-MOLDED PRINTED CIRCUIT BOARDS

[75] Inventors: Mitsuru Nozaki; Hirokatsu Nakamura, both of Tokyo, Japan

[73] Assignee: Mitsubishi Gas Chemical Company, Inc., Tokyo, Japan

[21] Appl. No.: 3,344

[22] Filed: Jan. 14, 1987

[30] Foreign Application Priority Data

Jan. 14, 1986 [JP] Japan .................................. 61-4212
Jun. 5, 1986 [JP] Japan .............................. 61-129303
Sep. 5, 1986 [JP] Japan .............................. 61-207819

[51] Int. Cl.$^4$ ............................................. B29C 33/40
[52] U.S. Cl. ..................................... 264/225; 264/227; 264/272.11; 264/272.15; 264/272.17
[58] Field of Search ............................. 264/225–227, 264/241, 263, 271.1, 272.11, 272.13, 272.14, 272.15, 272.17

[56] References Cited

U.S. PATENT DOCUMENTS

| | | | |
|---|---|---|---|
| 4,213,238 | 7/1980 | Gudorf | 264/225 X |
| 4,368,168 | 1/1983 | Slepcevic | 264/272.17 X |
| 4,395,817 | 8/1983 | Asada et al. | 264/272.17 X |
| 4,470,786 | 9/1984 | Sano et al. | 264/272.15 X |
| 4,513,942 | 4/1985 | Creasman | 264/272.17 X |
| 4,536,364 | 8/1985 | Lindskog | 264/227 |
| 4,650,625 | 3/1987 | Pentlow | 264/225 |
| 4,653,993 | 3/1987 | Boschman | 264/272.17 X |
| 4,681,718 | 7/1987 | Oldham | 264/272.11 X |
| 4,688,152 | 8/1987 | Chia | 264/272.17 X |

Primary Examiner—Tom Wyse
Attorney, Agent, or Firm—Sughrue, Mion, Zinn, Macpeak, and Seas

[57] ABSTRACT

A process of producing plastic-molded printed circuit boards by injection-molding a heat resistant plastic to form a plastic molding having many perforations and forming a conductive layer on the molding, which comprises molding the heat resistant plastic using a mold for injection-molding obtained by preparing a die set for injection-molding composed of a fixed side metal platen having at least an inlet for molten resin and forming a space for installing mold part(s), a stripper metal platen having, if necessary, an inlet for molten resin connected to the fixed side metal platen and forming a space for installing mold part(s), and a movable side metal platen forming a space for installing mold part(s); and assembling a pair of molds composed of a mold I having a concaved portion for cavity and a mold II having perforations for passing hard pins for forming holes and, if desired, a concaved portion for cavity, said molds being formed by a cured resin composition or a composite of a metal and a cured resin composition, and a hard pin mold III having hard pins for forming holes fixed thereto in such a manner that (a) the mold I is fixed to the fixed side metal platen, the mold II is fixed to the stripper metal platen, and the hard pin mold III is fixed to the movable side metal platen in this order, or (b) the hard pin mold III is fixed to the fixed side metal platen, the mold II is fixed to the stripper metal platen, and the mold I is fixed to the movable side metal platen in this order.

9 Claims, No Drawings

PROCESS OF PRODUCING PLASTIC-MOLDED PRINTED CIRCUIT BOARDS

FIELD OF THE INVENTION

This invention relates to a process of producing printed circuit boards using a plastic molding having many perforations formed by injection-molding. More particularly, the invention relates to a process of producing printed circuit boards using a plastic molding which is molded using an economical mold for injection-molding, which can be suitably used for producing many sorts of products, each being in a small quantity.

BACKGROUND OF THE INVENTION

Hitherto, as a mold for producing heat resistant plastic moldings having perforations, an ordinary steel mold for dies and a simple mold by a low melting metal has been used.

The aforesaid mold is properly selected according to the form of a desired molded product and, in particular, in the case of producing moldings having many small holes, the mold for use is usually composed of a fixed metal platen, a stripper metal platen, and a movable metal platen, wherein the cavity for molding is formed by the fixed metal platen and the stripper metal platen having perforations for passing hard metal pins disposed between the fixed metal platen and the stripper platen, small holes of the molded product are formed by the pins of a hard metal pin fixed platen equipped to the movable platen, and drawing of the hard metal pins for forming small holds from the molded product is performed by the stripper platen.

However, in the case of making such a mold of the type of forming the above-described molding cavity by steel, there is a disadvantage indispensably requiring working of many fine holes, fixing the hard metal pins for forming fine holes, surface working, etc., which are very troublesome in working and accuracy as well as from an economical viewpoint. Also, in the case of a low melting metal, it is required that for the portion of forming perforations, the hard metal pins are fixed in the pin-fix platen but there is a disadvantage that the hard pins thus fixed in are liable to be loosened by the action of heat or pressure.

SUMMARY OF THE INVENTION

As a result of various investigations on producing heat resistant plastic-molded printed circuit boards at low cost by solving the above-described problems and easily producing at low cost and in a short period of time a mold capable of forming moldings having various sorts of complicated perforations, the inventors have succeeded in attaining the present invention.

That is, according to the first embodiment of this invention, there is provided a process of producing plastic-molded printed circuit boards by injection-molding a heat resistant plastic to form a plastic molding having many perforations and forming a conductive layer on the molding, which comprising molding the heat resistant plastic using a mold for injection-molding obtained by preparing a die set for injection-molding composed of a fixed side metal platen having at least an inlet for molten resin and forming a space for installing mold part(s), a stripper metal platen having, if necessary, an inlet for molten resin connected to the aforesaid fixed side metal platen and forming a space for installing mold part(s), and a movable side metal platen forming a space for installing mold part(s); and assembling a pair of molds composed of a mold I having a concaved portion for cavity and a mold II having perforations for passing hard pins for forming holes and, if desired, a concaved portion for cavity, said molds being formed by a cured resin composition or a composite of a metal and a cured resin composition and a hard pin mold III having hard pins for forming holes fixed thereto in such a manner that (a) the mold I is fixed to the fixed side metal platen, the mold II is fixed to the stripper metal platen, and the hard pin mold III is fixed to the movable side metal platen in this order, or (b) the hard pin mold III is fixed to the fixed side metal platen, the mold II is fixed to the stripper metal platen, and the mold I is fixed to the movable side metal platen in this order.

Also, according to the second embodiment of this invention, there is provided a process of producing plastic-molded printed circuit board by injection-molding a heat resistant plastic to form a plastic molding having many perforations and forming a conductive layer on the molding, which comprises molding the heat resistant plastic using a mold for injection-molding composed of a fixed side metal platen having at least an inlet for molten resin and forming a space for installing mold part(s), a stripper metal platen having, if necessary, an inlet for molten resin connected to the aforesaid fixed side metal platen and forming a space for installing mold part(s), and a movable side metal platen forming a space for installing mold part(s); and assembling a pair of molds composed of a mold I having a concaved portion for cavity and a mold II having perforations for passing hard pins for forming holes and, if desired, a concaved portion for cavity, said molds being formed by a metal, and a hard pin mold III having the hard pins for forming holes fixed thereto by a cured resin in such a manner that (a) the mold I is fixed to the fixed side metal platen, the mold II is fixed to the stripper metal platen, and the hard pin mold III is fixed to the movable side metal platen in this order, or (b) the hard pin mold III is fixed to the fixed side metal platen, the mold II is fixed to the stripper metal platen, and the mold I is fixed to the movable side metal platen in this order.

DETAILED DESCRIPTION OF THE INVENTION

Then, the invention is explained below in detail.

The plastic-molded printed circuit boards in this invention are printed circuit boards prepared by forming a molding of a form such as a flat tabular plate, a partially concaved and/or convexed tabular plate, a curved plate, a bent plate, etc., having many small holes for electrically conducting the front surface to the back surface thereof as well as other holes and grooves by injection-molding a solderable heat resistant plastic, applying, if necessary, surface swelling with a solvent, surface activation of the molding by an activator including palladium, silver, copper, etc., to the molding; selectively or wholly forming thereon a copper layer or a nickel layer by electroless plating or vapor deposition; and forming through holes for electrically conducting the front surface to the back surface thereof and a circuit network by a method of finally forming a desired circuit; a method of coating, after surface treatment, a light-active catalyst on the surface of the molding, irradiating the surface thereof with light to selectively activate the surface, and electrolessly plating the activated portions only; or other method.

As the solderable heat resistant plastic which is used for forming a molding in this invention, there are heat resistant thermoplastic resins such as polysulfone, polyether imide, polyether sulfone, polyphenylene disulfide, polyphenylene ether, polyester series or other liquid crystal polymers, etc.; inter network polymers prepared by mixing thermoplastic resins such as polycarbonate, polyphenylene ether, etc., with a polyfunctional unsaturated compound, a low molecular weight 1,2-polybutadiene, an epoxy resin, a cyanate acid ester compound, or other thermosettable monomer in an amount of usually about 70 to 30% and adding thereto a catalyst such as an organic peroxide, an organic metal salt, etc., as described in Japanese Patent Application (OPI) No. 142297/79 (the term "OPI" as used herein refers to a "published unexamined Japanese patent application"), etc.; compositions prepared by properly adding a reinforcing material such as glass fibers, wollastonite, calcium carbonate, mica, etc., a filler, etc., to these resins; epoxy resins; phenol resins; cyanate ester resins; and other injection-moldable thermosetting resins. These resins or compositions have, as they are or after curing by heating, a heat resistance of an extent enduring a soldering step of 260° C.

The mold for producing a molding by injection-molding the aforesaid resin in the first embodiment of this invention is a mold for injection-molding obtained by preparing a die set for injection-molding composed of a fixed side metal platen having at least an inlet for molten resin and forming a space for installing mold part(s), a stripping metal platen having, if necessary, an inlet for molten metal connected to the aforesaid fixed side metal platen and forming a space for installing mold part(s), and a movable side metal platen forming a space for installing mold part(s); and assembling a pair of molds composed of a mold I having a concaved portion for cavity and, if desired, receiving holes for hard pins for forming holes of a plastic molding and a mold II having perforations for passing the hard pins for forming holes and, if desired, a concaved portion for cavity, said molds being formed by a cured resin composition or a composite of a metal and a cured resin composition and a hard pin mold III having the hard pins for forming holes fixed thereto by a cured resin composition in such a manner that (a) the mold I is fixed to the fixed side metal platen, the mold II is fixed to the stripper metal platen, and the hard pin mold III is fixed to the movable side metal platen in this order, or (b) the hard pin mold III is fixed to the fixed side metal platen, the mold II is fixed to the stripper metal platen, and the mold I is fixed to the movable side metal platen in this order.

The die set in this invention is composed of plates of an ordinary metal material for molds, such as iron, iron alloys, etc., having spaces or holes having desired sizes for fixing a pair of the molds I and II for cavity and the hard pin mold III previously formed thereto. In particular, the stripper metal platen is installed therein so that the phenomenon "dragging", etc., by inferior position matching of the stripper metal platen caused by opening and closing of the mold at injection-molding do not occur.

A pair of the molds I and II for cavity are formed by a cured resin composition or a composite of a metal and a cured resin composition.

As a thermosetting resin composition which is used for producing the aforesaid cured resin, there are cyanate ester resins (described in Japanese Patent Publication Nos. 1928/66, 11712/70, 1222/69, German Pat. No. 1,190,184, etc.), cyanate ester-maleimide resins, cyanate ester-maleimide-epoxy resins (described in Japanese Patent Publication Nos. 30440/79, 31279/77, U.S. Pat. No. 4,110,364, etc.), cyanate ester-epoxy resins (described in Japanese Pat. No. 41112/71, etc.), denatured maleimide resins mainly composed of a polyfunctional maleimide and an epoxy compound or an isocyanate compound (described in Japanese Patent Publication No. 8279/73, etc.), isocyanate-oxazolidine resins mainly composed of an isocyanate compound and an epoxy compound (described in Japanese Patent Application (OPI) No. 75418/70, etc.), epoxy resins such as polyfunctional epoxy resins mainly composed of trifunctional or more functional epoxy compounds, modified 1,2-polybutadiene resins, diallyl phthalate resins, silicone resins, etc.

The cured resin composition is prepared by compounding the aforesaid thermosetting resin with an inorganic filler such as a metal powder (e.g., a powder of iron, an iron-base alloy, nickel, a nickel-base alloy, cobalt, a cobalt-base alloy, aluminum, an aluminum-base alloy, copper, a copper-base alloy, silver, etc.), metal fibers, boron nitride, etc., in an amount of 65 to 15% by volume, preferably 65 to 40% by volume, and curing the mixture. The glass transition temperature of the cured product is at least 100° C., in particular, at least 150° C. The thermosetting resin composition for hard resin mold (i.e., before curing) has a fluidity at temperature of about 100° C. or less. Further, the glass transition temperature of the cured product prepared by using a molding of a prepreg obtained by impregnating a woven fabric or a nonwoven fabric composed of metal fibers, carbon fibers, glass fibers, all aromatic polyamide fibers, or a proper combination thereof with the thermosetting resin is suitably at least 100° C., in particular, at least 150° C.

Also, as the metal which is used for forming a composite of the metal and the cured resin composition, there are aluminum, an aluminum-base alloy, iron, an iron-base alloy, copper, a copper-base alloy, nickel, a nickel-base alloy, and other metals.

The mold cavity by the aforesaid cured resin composition or composite of a metal and the cured resin composition is produced by, for example, each of the following methods (i) to (ix):

(i) Method of making a model having the same form as that of a desired molding, properly adding a reinforcing material and other auxiliary materials to the thermosetting resin composition for hard resin mold, and obtaining a resin mold by casting.

(ii) Method of making a tabular plate by casting the thermosetting resin composition for hard resin mold followed by curing or making a laminate plate by laminating plural prepregs and forming the cavity surface by mechanical working.

(iii) Method of making a composite tabular plate by bonding a metal plate or a metal foil to a tabular plate of the cured resin composition using an adhesive or an adhesive sheet or by casting the resin composition onto one surface of a metal plate or a metal foil and forming the desired cavity portion by mechanical working, electro spark machining, etching, etc.

(iv) Method of making a composite tabular plate by bonding a metal plate or a metal foil to a laminate plate of a fiber-reinforced resin using an adhesive or an adhesive sheet and forming the desired cavity portion by mechanical working, electro spark machining, etching, etc.

(v) Method of making a composite tabular plate by laminating plural prepregs on one surface of a metal plate or a metal foil and forming the desired cavity portion by mechanical working, electro spark machining, etching, etc.

(vi) Method of making a composite tabular plate by bonding a metal plate or a metal foil to a metal plate using an adhesive or an adhesive sheet and forming the desired cavity portion by mechanical working, electro spark machining, etching, etc.

(vii) Method of making a model having the same form as that of a desired molding, obtaining a resin mold by casting the thermosetting resin composition for hard resin mold, and forming a metal layer on the cavity surface thereof applying thereto electroless plating and, if necessary, further applying thereon electroplating, etc.

(viii) Method of making a tabular plate by casting the thermosetting resin composition for hard resin mold or making a laminate plate by laminating plural prepregs, forming a cavity surface by mechanical working, and forming a metal layer on the surface by applying thereto electroless plating and, if necessary, further applying thereon electroplating, etc.

(ix) Method of making a composite tabular plate by applying electroless plating to the cavity surface obtained in the methods of (iii), (iv), (v) and (vi) above.

For the mold I produced by the above-described method are usually formed a concaved portion for cavity for forming a plastic molding, other desired concaved and/or convexed portions, and, if necessary, receiving holes for hard pins for forming holes, said receiving holes having a depth of 1 mm to 10 mm, at definite positions. Also, for the mold II which is fixed to the stripper metal platen are formed penetrations for passing the hard pins for forming holes at definite positions.

Also, for the method of producing the hard pin mold III, a method of fixing a pair of the molds I and II for cavity as described above while correctly disposing them, coating a mold releasing agent on the surface of the mold II, after inserting the hard pins, temporarily fixing them, casting a curing composition, and curing the composition or a method of fixing a pair of the molds I and II described above while correctly disposing them, after further placing a metal platen having perforations at the positions correctly corresponding to the positions of the perforations of the aforesaid molds I and II and other member(s) while correctly disposing them, inserting the hard pins, and fixing the hard pins using the aforesaid curing composition is particularly suitable from the viewpoint of dimensional precision. However, other method capable of fixing hard pins at highly precise positions can be as a matter of course employed.

Any curing compositions having a heat resistance to some extent can be used for the aforesaid purpose and examples of the curing composition are heat resistant gypsums, cements, plastic refractories, etc., but from the points of handlability, high shock resistance, less shrinkage by curing, etc., the above-described resin composition for hard resin mold, which is one of thermosetting resin compositions is preferred.

Also, the hard pin is composed of iron, stainless steel, high speed steel, etc., and usually has a diameter about 0.1 mm or more. The hard pin having a large diameter portion at an end thereof for securing stronger fixing of the hard pin or the hard pin in which a fluororesin, etc., is applied by baking onto at least a portion of the surface thereof, which will be disposed in the mold cavity portion, for improving the releasability of the pin from an injected resin is properly used.

A mold for use in this invention is constructed using the mold elements described above and set in an injection molding machine. Then, a heat-resistant plastic is injection-molded by the injection-molding machine to provide a molding for plastic-molded printed circuit boards.

The injection-molding condition, etc., are properly selected according to the nature of the plastic used. Also, the mold cavity portion wherein many small holes for conducting the front surface to the back surface, other holes, grooves, concaved and convexed portions, ribs, frames, etc., are properly formed for equipping parts to printed circuit boards, formation of a circuit network, reinforcing, and equipping printed circuit boards can be easily prepared and they are made as added matters to the molds I and II.

Furthermore, the molds for injection-molding differ variously according to the sort of gates and they may be properly employed.

Also, the mold for use in the second embodiment of this invention is the same as that in the first embodiment of this invention described above except that the molds I and II for cavity are made of a metal in place of the cured resin or the composite of the cured resin and metal and the hard pin mold III is made of the thermosetting resin composition for hard resin mold described above.

Then, the invention is further explained by referring to the following examples, wherein all parts, unless otherwise indicated, are by weight.

EXAMPLE 1

Preparation of Die Set

As the fixed side metal platen, a steel plate of 40 mm in thickness having an inlet for molten resin and a hole of 15 mm in depth and 90 mm × 90 mm in area for fixing the mold I for cavity was prepared, as the stripper metal platen, a steel plate of 10 mm in thickness having a hole of 90 mm × 90 mm in area for fixing the mold II for cavity was prepared, and as the movable side metal platen, a steel plate of 40 mm in thickness having a hole of 15 mm in depth and 85 mm × 85 mm in area for fixing the hard pin fixing mold III was prepared.

In addition, for these metal platens, introducing portions for molten resin such as sprues, runners, etc., fixing portions for fixing the assembly to mold, guide pin pushes, and other auxiliary jigs, etc., are formed as in ordinary molds.

Preparation of Mold for Cavity

First, after mixing 30 parts of 2,2-bis(4-cyanatophenyl)propane and 70 parts of an aluminum powder of 150 mesh, the mixture was stirred for 5 minutes at 80° C. to provide a fluid composition (hereinafter referred to as "composition $A_1$") as the thermosetting resin composition for casting. Also, 0.03 part of acetylacetone iron was mixed with 25 parts of a previously dissolved bisphenol A type epoxy resin (Epikote 828, viscosity 130 to 150 ps. at 25° C., epoxy equivalent 184 to 194, trade name, made by Yuka Shell Epoxy K.K.) and 75 parts of a copper powder of 300 mesh to provide a fluid composition (hereinafter referred to as "composition $B_1$"). Then, 75 parts of composition $A_1$ and 25 parts of composition $B_1$ prepared above were mixed with each other and melted at 60° C. to provide a resin composition for casting (hereinafter referred to as "composition $SR_1$").

Then, a kneaded mixture composed of gypsum and vinyl acetate emulsion was spread on a plate of 100 mm×100 mm in area at a thickness of 30 mm and an area of 91 mm×91 mm and a model obtained by coating a fluorine series mold release agent (Die Free MS-743, trade name, made by Daikin Industries, Ltd.) and drying was disposed at the center thereof. Then, polycarbonate plates of 5 mm in thickness were stood around the model at a height of 130 mm to form an open box. The composition $SR_1$ prepared above was heated to 60° C., poured in the open box and after evacuating the system up to 3 mm Hg and deaerating for 1 hour at 60° C., the composition was heated for 10 hours to 60° C. to gel the cast resin composition. The gelled product was taken out from the polycarbonate box, cured for 10 hours in a heating chamber kept at 180° C. to provide a mold I for cavity.

By following the same procedure as above without using model, composition $SR_1$ described above was casted, gelled, and cured. Then, 100 perforations each having a diameter of 0.92 mm were formed for the cured product at desired portions facing the cavity portion described above and working for external form was applied thereto to provide a mold II for cavity having a thickness of 10 mm and an area of 90 mm×90 mm.

Also, a hard pin mold III was prepared using composition $SR_1$ described above.

The mold II for cavity was superposed on the mold I for cavity with the cavity portion sides thereof in face-to-face relationship, high speed steel pins of 25 mm in length and 0.90 mm in diameter were inserted in the holes of the mold II, after temporarily fixing the pins with cyano acrylate, a silicone mold release agent was coated on the surface of the mold II excluding the pin-inserted portion, and further a frame made of polycarbonate plates having each side length of 86 mm and height of 100 mm was fixed thereon at a correct position.

Then, the composition $SR_1$ was poured therein at 60° C., kept for 4 hours while deaerating in vacuo, and gelled. After removing the molds I and II for cavity and the frame, the gelled product was cured as described above and working for external form was applied thereto to provide a hard pin mold III having an area of 85 mm×85 mm and a thickness (at cast portion) of 15 mm.

The glass transition temperature of the cast resin for the molds I and II and the hard pin mold III prepared as above was 175° C. and the heat deformation temperature thereof was 200° C.

Construction of Mold and Production of Molding

The mold I obtained above was fixed to the fixed side metal platen for die set, the mold II was fixed to the stripper metal platen, and the hard pin mold III was fixed to the movable side metal platen, each in correct position.

In addition, the stripper metal platen was mounted on the movable side metal platen so that the hard pins did not project from the cavity surface of the stripper metal platen in the case of opening the mold.

The injection mold thus constructed was set in an injection-molding machine and a polysulfone resin (P-1700, trade name, made by Union Carbide Co.) was molded at a pressure of 1,200 kg/cm$^2$, a cylinder temperature of 340° C., and a molding cycle of 2 minutes.

Production of Plastic-Molded Printed Boards

The molding obtained in the above step was immersed in a solution of 50 volume % of 35% hydrogen peroxide and 50 volume % of 98% sulfuric acid, then neutralized and washed with water. After drying, the whole surface of the molding was activated with palladium using a solution of tin chloride and palladium chloride and thereafter a copper layer of 20 $\mu$m in thickness was deposited thereon by thick electroless plating. Furthermore, a light-collapsing photosensitive etching resist was coated on the whole surface having the copper layer, a nega film for forming a printed circuit network previously prepared was set thereto, after irradiating the resist layer through the nega film with ultraviolet rays, the light-exposed portions of the layer were removed, and the exposed copper was removed by an etching method. Thereafter, the remaining resist layers were removed to provide a printed circuit board in which the front surface was conducted to the back surface thereof.

EXAMPLE 2

After uniformly mixing 30 parts of bis(4-maleimidophenyl)propane, 60 parts of the bisphenol A type epoxy resin as used in Example 1, and 50 parts of diphenylmethane diisocyanate (MDI-CR, trade name, made by Mitsui Toatsu Chemicals, Inc.), 400 parts of an aluminum powder of 150 mesh and 0.5 part of 2-ethyl-4-methylimidazole were added to the mixture and the mixture was mixed at 60° C. to provide a thermosetting resin composition for casting.

By following the same procedure as in Example 1 using the resin composition for casting obtained above except that aluminum plates were used for making box in place of the polycarbonate plates and the gelation temperature was changed to 170° C. molds I and II and a hard pin mold III were prepared. The glass transition temperature of the cast resin composition was 220° C.

EXAMPLE 3

After mixing 30 parts of bis(4-maleimidophenyl)propane and 70 parts of the bisphenol A type epoxy resin as used in Example 1 for 30 minutes at 120° C., the mixture was cooled to 50° C. and mixed with 5 parts of dichlorodiaminodiphenylmethane, 0.5 part of dicumyl peroxide, and 300 parts of an iron powder to provide a resin composition for casting.

By following the same procedure as in Example 1 using the resin composition for casting obtained above except that iron plates were used for making the box in place of the polycarbonate plates and the gelation temperature was changed to 160° C., molds I and II and a hard pin mold III were prepared. The glass transition temperature of the cast resin composition was 200° C.

EXAMPLE 4

After uniformly mixing 25 parts of diallyl phthalate prepolymer and 75 parts of diallyl phthalate monomer at 80° C., the mixture was cooled and uniformly mixed with 350 parts of a copper powder and then mixed with 2 parts of t-butyl peroxy benzoate for 20 minutes at 40° C. to provide a resin composition for casting.

By following the same procedure as in Example 1 using the resin composition for casting prepared above except that iron plates were used for making the box in place of the polycarbonate plates and the gelation temperature was changed to 150° C., molds I and II and a hard pin mold III were prepared. The glass transition temperature of the cast resin composition was 160° C.

EXAMPLE 5

By following the same procedure as in Example 1 except that the mold for cavity prepared by the manner described below was used, a good both surface-conducted printed circuit board was obtained.

By mixing 30 parts of a prepolymer prepared by stirring 2,2-bis(4-cyanatophenyl)propane for 3 hours at 150° C. with 70 parts of an aluminum powder of 150 mesh, a composition was prepared. Then, 75 parts of the composition was mixed with 25 parts of a bisphenol A type epoxy resin (Epikote 828, viscosity 120 to 150 ps. at 25° C., epoxy equivalent 184 to 194, trade name, made by Yuka Shell Epoxy Co.) containing 0.10 part of zinc octylate, a resin composition for resin mold (hereinafter referred to as "SR$_2$") was prepared.

After surrounding an aluminum alloy plate of 2 mm in thickness and 100 mm×100 mm in area, the composition SR$_2$ prepared above was poured at 60° C., after deaerating, they were heated to 80° C. for 2 hours and further the resin composition was cured for 8 hours at 170° C. to provide a composite plate of aluminum/curing resin having a whole thickness of 10 mm. From the plate, two tabular plates each having an area of 90 mm×90 mm were made.

One of the composite plates was masked with a resist except the center portion and the aluminum alloy at the center portion was dissolved off by etching to provide a mold I having a cavity of 50 mm×50 mm in area and 2 mm in depth at the center portion of the aluminum alloy surface.

For another composite plate were formed 100 perforations each having a diameter of 0.92 mm at desired positions facing the aforesaid cavity portion to provide a mold II.

Also, a hard pin mold III was prepared by the method of using the resin composition for hard resin mold described above.

The mold II prepared above was superposed on the mold I for cavity at the cavity portion side thereof. High speed steel pins each having a length of 25 mm and a diameter of 0.90 mm were inserted in the holes of the mold II, after temporarily fixing the pins with cyano acrylate, a silicone resin mold release agent was coated on the surface of the mold II excluding the pin-inserted portions and also a polycarbonate plate frame having each side length of 86 mm and a height of 100 mm was fixed thereon at a correct portion.

Then, the composition SR$_2$ was poured into the framed space and kept for 4 hours while deaerating in vacuo to gel the resin composition. Then, after removing the molds I and II for cavity and the frame, the gelled resin product was post-cured for 8 hours in a chamber kept at 175° C. and then working for external form was applied thereto to provide a hard pin mold III having an area of 85 mm×85 mm and a thickness (cast portion) of 15 mm.

EXAMPLE 6

After pre-reacting 90 parts of 2,2-bis(4-cyanatophenyl)propane and 10 parts of bis(4-maleimidophenyl)methane for 2 hours at 150° C., 10 parts of bisphenol A type epoxy resin (EPON 828, trade name) and 0.03 part of zinc octoate as a catalyst were added to the prereacted product and the mixture was dissolved in methyl ethyl ketone to provide a varnish. A carbon fiber fabric of 0.4 mm in thickness was impregnated with the varnish and dried to provide a prepreg of B-stage.

Then, 20 sheets of the prepregs were laminated and an aluminum alloy plate of 2 mm in thickness was superposed on one side thereof. The assembly was heated at 200° C. for 2 hours under a pressure of 10 kg/cm$^2$ to provide an aluminum alloy plate-having laminate plate of 10 mm in thickness. Also, 25 sheets of the prepregs were laminated and heated for 2 hours to 200° C. while pressing at a pressure of 10 kg/cm$^2$ to provide a laminate plate having a thickness of 10 mm.

Then, by following the same procedure as in Example 5 except that the aluminum alloy plate-having laminate plate obtained in the above step was used for producing the mold I for cavity and the laminate plate obtained above was used for producing the mold II, a good both surface-conducted printed circuit board was obtained.

EXAMPLE 7

One sheet of the prepreg obtained as in Example 6 was superposed on an aluminum plate of 7.6 mm in thickness, further an aluminum alloy plate of 2 mm in thickness was superposed on the prepreg, and the laminate was heated to 200° C. for 2 hours while pressing at 10 kg/cm$^2$ to provide a composite laminate plate of aluminum plate/carbon fiber-reinforced resin/aluminum alloy plate having a whole thickness of 10 mm.

Then, by following the same procedure as in Example 5 except that the composite laminate plate of aluminum plate/carbon fiber-reinforced resin/aluminum alloy plate obtained in the above step was used for producing the mold I and mold II for cavity and in the case of the mold I, an aluminum plate having a thickness of 5 mm was inserted as a spacer, a good both surface-conducted printed circuit board was obtained.

EXAMPLE 8

A steel plate of 40 mm in thickness having an inlet for molten resin and 4 holes each of 15 mm in depth and 120 mm×90 mm in area for fixing a mold I for cavity at symmetrical positions with an interval of 30 mm was prepared as the fixed side metal platen, a steel plate of 10 mm in thickness having four holes each of 120 mm×90 mm in area for fixing a mold II for cavity at the same positions as above was prepared as the stripper metal platen, and a steel plate of 40 mm in thickness having four holes each of 15 mm in depth and 110 mm×85 mm in area for fixing a hard pin mold III at the same positions as above was prepared as the movable side metal platen. In addition, for preparing the aforesaid metal platens, die sets having introducing portions for molten resin, such as sprues (center), runners, etc., fixing portions for fixing the parts for constructing the mold, guide pin pushes, and other auxiliary jigs were, as a matter of course, used as the case of preparing ordinary molds.

For molds I and II for cavity, 8 plates each having an area of 120 mm×90 mm were prepared using the composite laminate plate of aluminum plate/carbon fiber-reinforced resin/aluminum alloy plate as prepared in Example 7.

The whole surface of the plate was masked by a resist and the aluminum alloy was dissolved off by an etching method to provide a mold I having a cavity of 90 mm×60 mm in area on the aluminum alloy surface contacting with the two sides of the plate. Thus, four molds I were prepared.

For each of the remaining plates, 150 perforations each of 0.92 mm in diameter were formed with a pitch of 2.5 mm at definite positions corresponding to the aforesaid cavity portion to provide four molds II.

Also, hard pin molds III were prepared as follows. The mold II for cavity obtained in the above step was superposed on the mold I for cavity obtained above. Also, a box of aluminum plates each of 1 mm in thickness having a height of 15 mm and area of 110 mm×85 mm was prepared and perforations each of 0.92 mm in diameter were formed at the same positions as those of the perforations of the mold II. The box was placed on the mold II superposed on the mold I, high speed steel pins each having a length of 25 mm and a diameter of 0.90 mm were inserted in the holes and temporarily fixed by cyano acrylate. Thereafter, the resin composition $SR_1$ as in Example 1 was poured in the box, kept for 4 hours while deaerating in vacuo to gel the resin composition, and after removing the molds I and II for cavity and the frame, the gelled product was pre-cured as in Example 1.

Four molds I prepared above were set to the fixed side metal platen for die set using a 5 mm thick aluminum plate as a spacer, four molds II prepared above were fixed to the stripper metal platen, and four hard pin molds III were fixed to the movable metal platen at correct positions and by following the same procedure as in Example 7 except for using the mold thus constructed, a good both surface-conducted printed circuit board was obtained.

EXAMPLE 9

The die set was prepared as follows.

A steel plate of 10 mm in thickness having an inlet for molten resin and 2 holes each of 15 mm in depth and 120 mm×90 mm in area for fixing a mold I for cavity at symmetrical positions with an interval of 60 mm was prepared as the fixed side metal platen, a steel plate of 10 mm in thickness having 2 holes each of 120 mm×90 mm in area for fixing a mold II for cavity at the same positions as above was prepared as the stripper metal platen, and a steel plate of 40 mm in thickness having 2 holes each of 15 mm in depth and 110 mm×85 mm in area for fixing a hard pin mold III at the same positions as above was prepared as the movable side metal platen. In addition, for preparing the aforesaid metal platens, die sets having introducing portions for molten resin, such as sprues (center), runners, etc., fixing portions for fixing the parts for constructing the mold, guide pin pushes, and other auxiliary jigs were, as a matter of course, used as the case of preparing ordinary molds.

Molds I and II for cavity were prepared as follows.

The area of 100 mm×70 mm at the center of both sides of a laminate board of 120 mm×90 mm in area and 2 mm in thickness and having a 70 μm thick copper foil on both sides thereof was subjected to the conventional etching method to remove copper foils, thereby forming a printed wiring network having the width of the removed copper foil of 0.30 mm. The same release agent as used in Example 1 was coated thereon and dried to prepare a model.

Using this model, the same $SR_1$ as obtained in Example 1 was cast in the same manner as in Example 1 to obtain a casting plate having projecting portions for forming the desired wiring pattern as the grooves. After processing, two cured casting plates having an area of 120 mm×90 mm and a thickness of 13 mm and two cured casting plates having an area of 120 mm×90 mm and a thickness of 10 mm were prepared. To the pattern side of the 13 mm thick coating plates, conventional pre-treatment by chemical deposition using nickel carbonyl was applied at 170° C. and electroless plating of hard nickel was then applied (plating thickness: 10 μm) to prepare two molds I not having pattern portion on the 10 mm peripheral portion. The pattern sides of the 10 mm thick casting plates were plated in the same manner and 150 perforations having a diameter of 0.92 mm were provided on the predetermined positions thereof to prepare two molds II.

Also, hard pin molds III were prepared as follows.

The mold II for cavity obtained in the above step was superposed on the mold I for cavity obtained above. A 1.98 mm thick plate having a perforation of 100 mm×70 mm in area, taking into consideration the thickness of plating, was interposed therebetween. Also, a box of aluminum plates each of 1 mm in thickness having a height of 15 mm and area of 110 mm×85 mm was prepared and perforations each of 0.92 mm in diameter were formed at the same positions as those of the perforations of the mold II. The box was placed on the mold II superposed on the mold I, high speed steel pins each having a length of 25 mm and a diameter of 0.90 mm were inserted in the holes and temporarily fixed by cyano acrylate. Thereafter, the resin composition $SR_1$ as in Example 1 was poured in the box, kept for 4 hours while deaerating in vacuo to gel the resin composition, and after removing the molds I and II for cavity and the frame, the gelled product was pre-cured as in Example 1.

Two molds I prepared above were set to the fixed side metal platen for die set, two molds II prepared above were fixed to the stripper metal platen, and two hard pin molds III were fixed to the movable metal platen at correct positions and by following the same procedure as in Example 1 except for using the mold thus constructed, a good both surface-conducted printed circuit board molding having through holes and the same patterns having grooves of the depth of about 0.1 mm and the width of 0.3 mm as in the wiring patterns was obtained.

This molding was surface treated and surface activated in the same manner as in Example 1, and electroless plating was applied thereto to form a 2 μm thick copper layer. The both sides were polished to remove the formed copper layer except for grooves and hole portions. Electroless plating was further applied thereto to form a 40 μm thick copper layer on the remaining copper surface to plate the wirings and through holes. The peripheral portion of 10 mm was removed by cutting to obtain a good both surface-conducted printed circuit board.

EXAMPLE 10

Molds were prepared in the same manners as in Example 9 except that molds I and II for cavity were obtained as follows, to obtain a good both surface-conducted printed circuit board.

SR$_1$ as obtained in Example 1 was cast on 105 μm thick copper foils to obtain 13.1 mm thick casting plates having copper foils and 10.1 mm thick coating plates having copper foils. The copper foil side of the 13.07 mm thick casting plate was processed by the conventional etching method to obtain a casting plate having as projections the reverse pattern of the desired wiring pattern. The electroless plating of hard nickel was applied thereto (plating thickness: 10 μm) in the same manner as in Example 9 to obtain two molds I not having the pattern portion on the 10 mm peripheral portion. Similarly, the 10.1 mm casting plate was etching processed to obtain a casting plate having as projections the reverse pattern of the desired wiring pattern. After applying the same electroless plating as in Example 9, 150 perforations having a diameter of 0.92 mm were provided at the predetermined portions to obtain two molds II.

EXAMPLE 11

Molds were prepared in the same manners as in Example 9 except that molds I and II for cavity were obtained as follows, to obtain a good both surface-conducted printed circuit board.

SR$_1$ as obtained in Example 1 was cast on a 105 μm thick steel foil to obtain a 13.1 mm thick casting plates having steel foils and 10.1 mm thick casting plates having steel foils. The steel foil side of the 13.1 mm thick casting plate was processed by the conventional etching method to obtain a casting plate having as projections (width: 0.3 mm and depth: 0.1 mm) the reverse pattern of the desired wiring pattern, whereby two molds I not having the pattern portion on the 10 mm peripheral portion was obtained. Similarly, the 10.1 mm casting plate was etching processed to obtain a casting plate having as projections the reverse pattern of the desired wiring pattern. 150 Perforations having a diameter of 0.92 mm were provided at the predetermined portions to obtain two molds II.

EXAMPLE 12

Two aluminum alloy plates each having a thickness of 10 mm and an area of 90 mm×90 mm were prepared.

At the center of one of the plates was formed a hole of 2 mm in depth and 50 mm×50 mm in area by scraping and also at the central portion thereof was formed a gate portion by boring to provide a metal mold I for cavity.

For the other metal plate were formed 100 perforations each of 0.92 mm in diameter at the same positions as above to provide a metal mold II for cavity.

Furthermore, by following the same procedure as in Example 5 except that the metal molds I and II for cavity were used, a hard pin mold III was prepared.

Then, by following the same procedure as in Example 7 except that the metal molds I and II for cavity and the hard pin mold III obtained as above were used, a good both surface-conducted printed circuit board was obtained.

As described above in the process of this invention for producing plastic-molded printed circuit boards, the cavity for forming the molding for desired plastic-molded printed circuit boards is produced by using a mold obtained by fixing the mold for mold cavity, the hard pin movable mold and the hard pin mold to a die set, and hence the mold for cavity and the hard pin movable mold the production of which is difficult in conventional techniques can be easily prepared.

Thus, according to the process of this invention, plastic-molded printed circuit boards can be economically and quickly produced and hence many sorts of products, each being small amount, can be produced at very low cost and with a high producibility. Furthermore, small holes for conducting both surfaces, and other holes, grooves, concaved portions and/or convexed portions, ribs, frames, etc., for equipping circuit networks, parts, and circuit boards, etc., can be easily formed at the mold cavity portions and hence the freedom for designs, etc., is improved and new uses of plastic-molded printed circuit boards showing good producibility and having good finish have been developed.

While the invention has been described in detail and with reference to specific embodiments thereof, it will be apparent to one skilled in the art that various changes and modifications can be made therein without departing from the spirit and scope thereof.

What is claimed is:

1. A process of producing plastic-molded printed circuit boards by injection-molding a heat resistant plastic to form a plastic molding having many perforations and forming a conductive layer on the molding, which comprises molding the heat resistant plastic using a mold for injection-molding obtained by preparing a die set for injection molding composed of a fixed size metal platen having at least an inlet for molten resin and forming a space for installing mold part(s), a stripper metal platen forming a space for installing mold part(s), and a movable side metal platen forming a space for installing mold part(s); and assembling a pair of molds composed of a mold I having a concaved portion for cavity and a mold II having perforations for passing hard pins for forming holes, said molds being formed by a cured resin composition, a composite of a metal and a cured resin composition or a metal, and a hard pin mold III having hard pins for forming holes fixed thereto in such a manner that the mold I is fixed to the fixed side metal platen, the mold II is fixed to the stripper metal platen, and the hard pin mold III is fixed to the movable side metal platen in this order.

2. The process as claimed in claim 1, wherein the cured resin composition is a composite of a curing resin composition the glass transition temperature of the cured product of which is at least 150° C., a powder, fibers, and fiber cloth.

3. The process as claimed in claim 2, wherein the curing resin composition is at least one selected from the group consisting of a cyanate ester resin, a cyanate ester-maleimide resin, a cyanate ester-maleimideepoxy resin, a cyanate ester-epoxy resin, a modified maleimide resin mainly composed of a polyfunctional maleimide, an epoxy compound and an isocyanate compound, an isocyanate-oxazolidone resin mainly composed of an isocyanate compound and an epoxy compound, and a polyfunctional epoxy resin mainly composed of polyfunctional epoxy compound(s) more than trifunctional epoxy compound.

4. The process as claimed in claim 3, wherein the curing composition is at least one selected from the group consisting of a cyanate ester resin, a cyanate ester-maleimide resin and a cyanate ester-maleimideepoxy resin.

5. The process as claimed in claim 1, wherein the cured resin composition is produced by a resin composition composed of 35 to 60% by weight of a curing resin composition the glass transition temperature of the cured product of which is at least 150° C. and 65 to 40% by weight of a filler mainly composed of a metal powder or metal fibers, said resin composition having fluidity at temperature of 100° C. or less.

6. The process as claimed in claim 1, wherein the cured resin composition is produced by laminating prepregs each prepared by impregnating a reinforcing material composed of at least one of a metal fiber cloth, a carbon fiber cloth, a glass fiber cloth, and an all aromatic polyamide cloth with a curing resin composition the glass transition temperature of the cured product of which is at least 150° C., the proportion of said reinforcing material in the prepreg is in the range of 65 to 30% by volume.

7. The process as claimed in claim 1, wherein said mold II has a concaved portion for cavity.

8. A process of producing plastic-molded printed circuit boards by injection-molding a heat resistant plastic to form a plastic molding having many perforations and forming a conductive layer on the molding, which comprises molding the heat resistant plastic using a mold for injection-molding composed of a fixed side metal platen having at least an inlet for molten resin and forming a space for installing mold part(s) a stripper metal platen having an inlet for molten resin connected to the fixed side metal platen and forming a space for installing mold part(s); and assembling a pair of molds composed of a mold I having a concaved portion for cavity and a mold II having perforations for passing hard pins for forming holes, said molds being formed by a resin composition, a composite of metal and a cured resin composition or a metal, and a hard pin mold III having the hard pins for forming molds fixed thereto by a cured resin in such a manner that the hard pin mold III is fixed to the fixed side metal platen, the mold II is fixed to the stripper metal platen, and the mold I is fixed to the movable side metal platen in this order.

9. The process as claimed in claim 8, wherein said mold II has a concaved portion for cavity.

* * * * *